United States Patent
Zayets

(10) Patent No.: US 7,171,096 B2
(45) Date of Patent: Jan. 30, 2007

(54) NON-VOLATILE OPTICAL MEMORY ELEMENT UTILIZING OPTICALLY INDUCED MAGNETIZATION REVERSAL AND OPERATIONAL METHOD THEREOF

(75) Inventor: Vadym Zayets, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 16 days.

(21) Appl. No.: 11/172,861

(22) Filed: Jul. 5, 2005

(65) Prior Publication Data
US 2006/0002037 A1      Jan. 5, 2006

(30) Foreign Application Priority Data
Jul. 5, 2004    (JP) ............................ 2004-197964

(51) Int. Cl.
*G02B 6/10* (2006.01)
(52) U.S. Cl. ............... 385/131; 360/324.2; 369/112.09
(58) Field of Classification Search ............... 385/131; 360/324.2; 369/112.09
See application file for complete search history.

(56) References Cited

U.S. PATENT DOCUMENTS 5,986,858 A * 11/1999 Sato et al. ............... 360/324.2
6,052,263 A * 4/2000 Gill ........................ 360/324.11
6,259,586 B1 * 7/2001 Gill ......................... 360/324.2
6,724,586 B2 * 4/2004 Gill ......................... 360/324.2
2006/0177188 A1 * 8/2006 Ishizaki et al. ............. 385/132

* cited by examiner

Primary Examiner—Ellen E. Kim
(74) Attorney, Agent, or Firm—Rader, Fishman & Grauer PLLC

(57) ABSTRACT

The present invention relates to a high-speed optical memory element. In order to increase speed of a memory element, optical pulse is recorded and read all-optically without conversion into electrical signal at very high speed. Optically-induced spin accumulation is used for recording the ferromagnetic metal embedded into optical waveguide operates as a high speed memory element. The ferromagnetic metal is sandwiched between a conductor on one side and a tunnel barrier followed by a conductor on the other side. The voltage is applied between two conductors. For data recording, the optically induced spin-polarized tunneling and spin accumulation is used. The optically induced spin-polarized tunneling occurs due to absorption of circularly polarized light. The torque of accumulated spin reverses magnetization of ferromagnetic metal. For reading Faraday rotation or non-reciprocal loss/gain in semiconductor-ferromagnetic-metal hybrid is used.

14 Claims, 15 Drawing Sheets

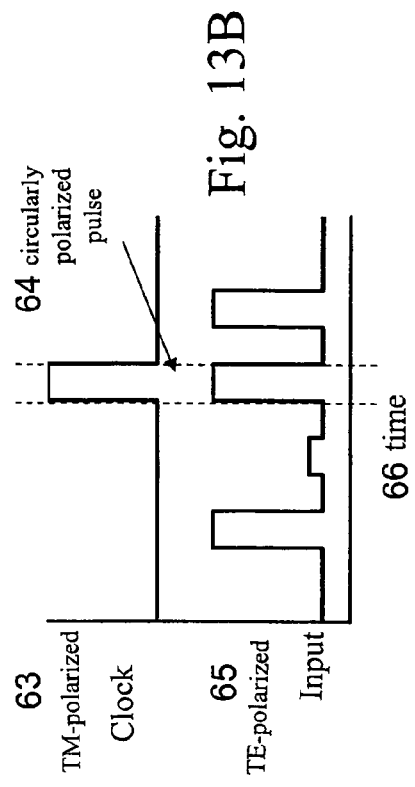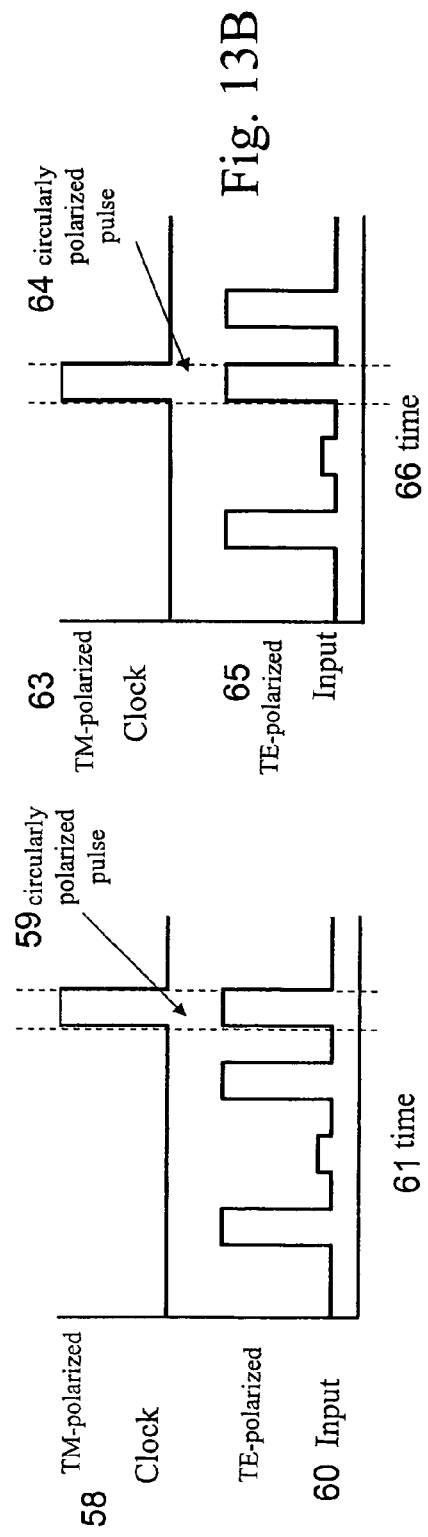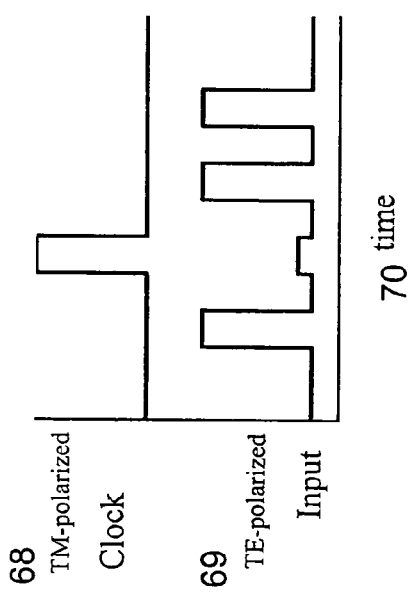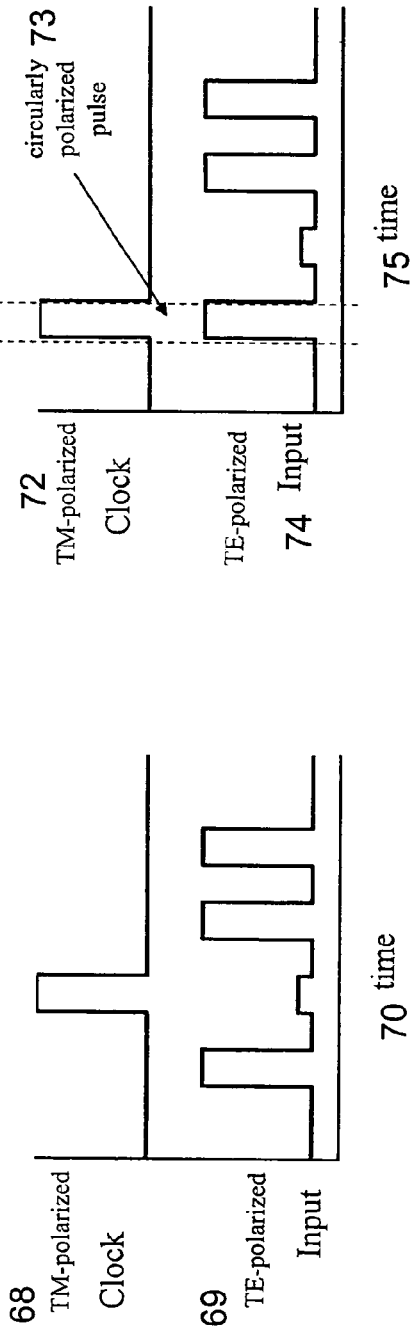

Reading. Y-magnetized reading z-magnetization

NON-VOLATILE OPTICAL MEMORY ELEMENT UTILIZING OPTICALLY INDUCED MAGNETIZATION REVERSAL AND OPERATIONAL METHOD THEREOF

TECHNICAL FIELD OF THE INVENTION

The present invitation relates to a high-speed optical memory element(s), which forms an essential element(s) in an optical communication system and an optical application system.

DESCRIPTION OF RELATED ART

A high-speed non-volatile optical memory is very important for optical networks. High-speed data processing such as receiving, storing and resending are main functions of an optical network server. Therefore, such a high-speed optical memory is one of most important components for the optical networks.

FIG. 1 shows a typical format of data used in the optical network, for example, in optical Internet. The data is sent by packages (packets). Inside the package, a time interval between pulses is very short (order of a few picoseconds). On the other hand, a time interval between packages is relatively long (order of a few hundreds of picoseconds or a few nanoseconds). The server receives packages, makes route decision and resends them to a given destination.

According to the present invention, it is possible to record, store and resent the data of such a format. In U.S. Pat. No. 5,740,117, a method of storing optical signals in a loop structure is described. In the method, a fixed amount of information within the optical loop can be stored. U.S. Pat. No. 6,647,163 discloses an optical memory device with Mach-Zender interferometer featuring semiconductor optical amplifiers.

A non-volatile high-speed optical memory element is disclosed in Japanese Patent application No. 2003-328895. In Japanese Patent Application for data recording, the effect that coercive force of ferromagnetic metal changes by heating the ferromagnetic material with an optical pulse(s) is used. In the present invention, optical induced magnetization reversal of ferromagnetic material is used for the data recording.

Current induced magnetization reversal has been proved theoretically (J. C. Slonczewski Journal of Magnetism and Magnetic Materials, Vol. 159, pp. L1–L7, 1996; J. Z. Sun Physical Review B, Vol. 62, pp. 570–578, July 2000) and experimentally (J. Z. Sun, Journal of Magnetism and Magnetic Materials, Vol. 202, pp. 157, 1999; F. J. Albert, N. C. Emley, E. B. Myers, D. C. Ralph; and R. A. Buhrman Physical Review Letters Vol. 89, pp. 226802, November 2002). In case that spin-polarized current flows from first ferromagnetic material to second ferromagnetic material, spin accumulation in the second ferromagnetic material occurs. Under torque of the accumulated spin, magnetization of the second ferromagnetic material is reversed in parallel to magnetization of the second ferromagnetic material.

In Japanese Patent application No. 2003-328895, a tunnel magneto-resistive electrode is used for data reading from an optical memory element. In the present invention, in order to read data at a high speed from a memory element, magneto-optical polarization rotation in ferromagnetic-metal-semiconductor hybrid amplifier (U.S. Pat. No. 5,598,492; J. M. Hammer, J. H. Abeles, and D. J. Channin, IEEE Photon. Technol. Lett. vol. 9, pp. 631–633, May 1997) is used. Also in the present invention, in order to read data, the dependence of optical gain in magnetization direction in ferromagnetic-metal-semiconductor hybrid amplifier (W. Zaets and K. Ando, IEEE Photon. Technol. Lett. Vol. 11, pp. 1012–1014, August 1999) is used.

SUMMARY OF INVENTION

In view of the above problem, it is an object of the present invention to speed up data recording and reading. It is another object of the present invention to provide a device capable of non-volatile storing of optical data.

The objects of the invention are achieved by the technology set forth below.

(1) The present invention provides a high-speed optical memory element which comprises on an optical waveguide having two cladding regions, and a core region whose refractive index is higher than that of the cladding. Most of light travels in the core region while reflected by the cladding, but little light travels inside the cladding. The size of ferromagnetic metal region is small enough so that the ferromagnetic metal region is in single-domain state. The ferromagnetic-metal region is close enough to the waveguide core region or is inside core region so that light propagating in the waveguide penetrates into ferromagnetic metal region. The ferromagnetic metal is sandwiched between a first conductive region and tunnel barrier followed by a second conductive region. The data is stored in the memory element by means of two opposite direction of magnetization of ferromagnetic-metal region (2) The present invention provides a recording method for a high-speed memory element utilizing optically-induced spin-accumulation in the ferromagnetic metal. The voltage is applied between the first and second conductive regions. Circularly-polarized optical input pulse is absorbed by ferromagnetic metal. It excites spin-polarized electrons to high energy level. These electrons are tunneling through tunnel barrier into second conductive region. The electrons of both spin polarization flows from first conductive region into ferromagnetic metal. Thus, spin is accumulated in the ferromagnetic metal. The torque of accumulated spin reverses the magnetization of ferromagnetic metal.

(3) The present invention provides a recording method for a high-speed memory element utilizing optically-induced spin-accumulation in the ferromagnetic metal. The voltage is applied between the first and second conductive regions. Circularly-polarized optical input pulse is absorbed by the second conductive region. It excites spin-polarized electrons to high energy level in the second conductive region. These electrons are tunneling from the second conductive region through tunnel barrier into ferromagnetic metal. The electrons of both spin polarization flow from ferromagnetic metal. Thus, spin is accumulated in the ferromagnetic metal. The torque of accumulated spin reverses the magnetization of ferromagnetic metal.

(4) The present invention provides a reading method for a high-speed memory element utilizing dependence of optical gain in ferromagnetic-metal-semiconductor hybrid on direction of magnetization of ferromagnetic metal.

(5) The present invention provides a reading method for a high-speed memory element utilizing dependence of a direction of polarization rotation in ferromagnetic-metal on direction of magnetization of ferromagnetic metal.

(6) The present invention provides a high-speed optical memory which contains a set of high-speed memory elements (1), which is able to record and read the train of optical pulses. The delayed clock pulse is used to select corresponding memory element to read and record each pulse in the pulse train. Formation of circularly-polarized pulse from linearly-polarized clock pulse and linearly polarized input pulse provides high speed of data recording into memory element.

Thus, the present invention possesses a number of advantages or purposes, and there is no requirement that every claim directed to that invention be limited to encompass all of them.

In addition, the foregoing has outlined rather broadly the features and technical advantages of the present invention in order that the detailed description of the invention that follows may be better understood. Additional features and advantages of the invention will be described hereinafter which form the subject of the claims of the invention.

For a more complete understanding of the present invention, and the advantages thereof, reference is now made to the following descriptions taken in conjunction with the accompanying drawings, in which:

BRIEF DESCRIPTION OF THE DRAWINGS

FIGS. 13A, 13B, 13C and 13D show schematic diagrams illustrating time diagram for input and clock pulses for different cells;

DATAILED DESCRIPTION OF THE INVENTION

Description of representative embodiments of the present invention is now given, referring to drawings. While the present invention is not necessarily limited to such embodiments, an appreciation of various aspects of the invention is best gained through a discussion of the various examples.

Figure 1:
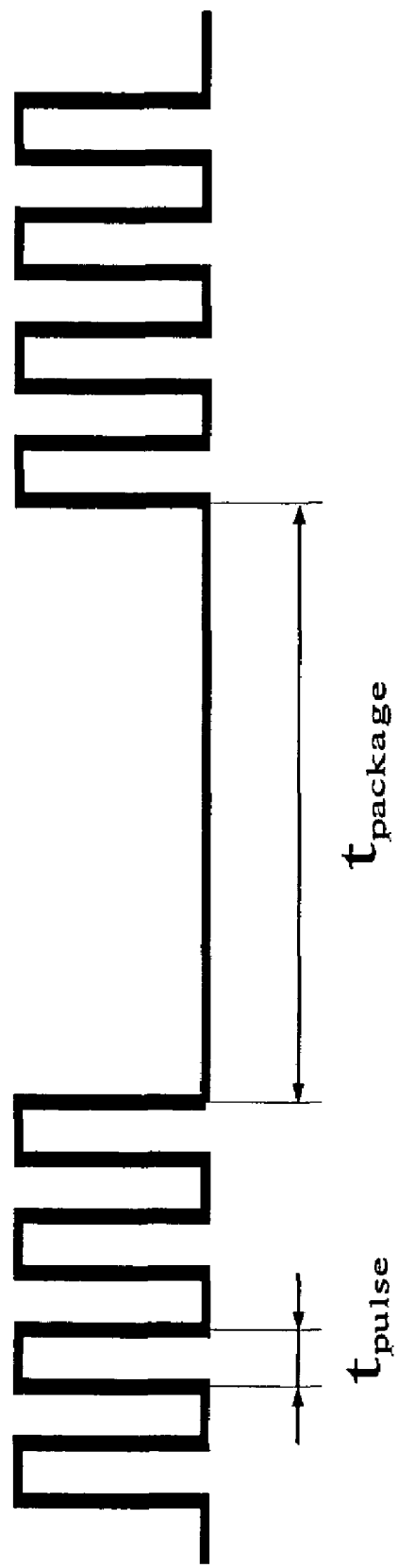
FIG. 1 is a schematic diagram illustrating timing between pulses used in optical communication links. $t_{pulse}$—short time interval between pulses in one package, $t_{package}$—relatively long time interval between packages.

FIG. 1 is a schematic diagram illustrating timing between pulses used in optical communication links. ($t_{pulses}$—short interval between pulses in one package, $t_{packages}$—relatively long time interval between packages.)

FIG. 1 shows a typical format of data used in optical networks, for example, in optical Internet. The data is sent by packages (or packets). Inside the package the time interval between pulses is very short (order of a few picoseconds). On the other hand, a time interval between packages is relatively long (order of a few hundreds of picoseconds or a few nanoseconds). A server receives packages, makes route decision and resends them to a given destination. According to the present invention, it is possible to record, store and resent the data in such a format.

Figure 2:
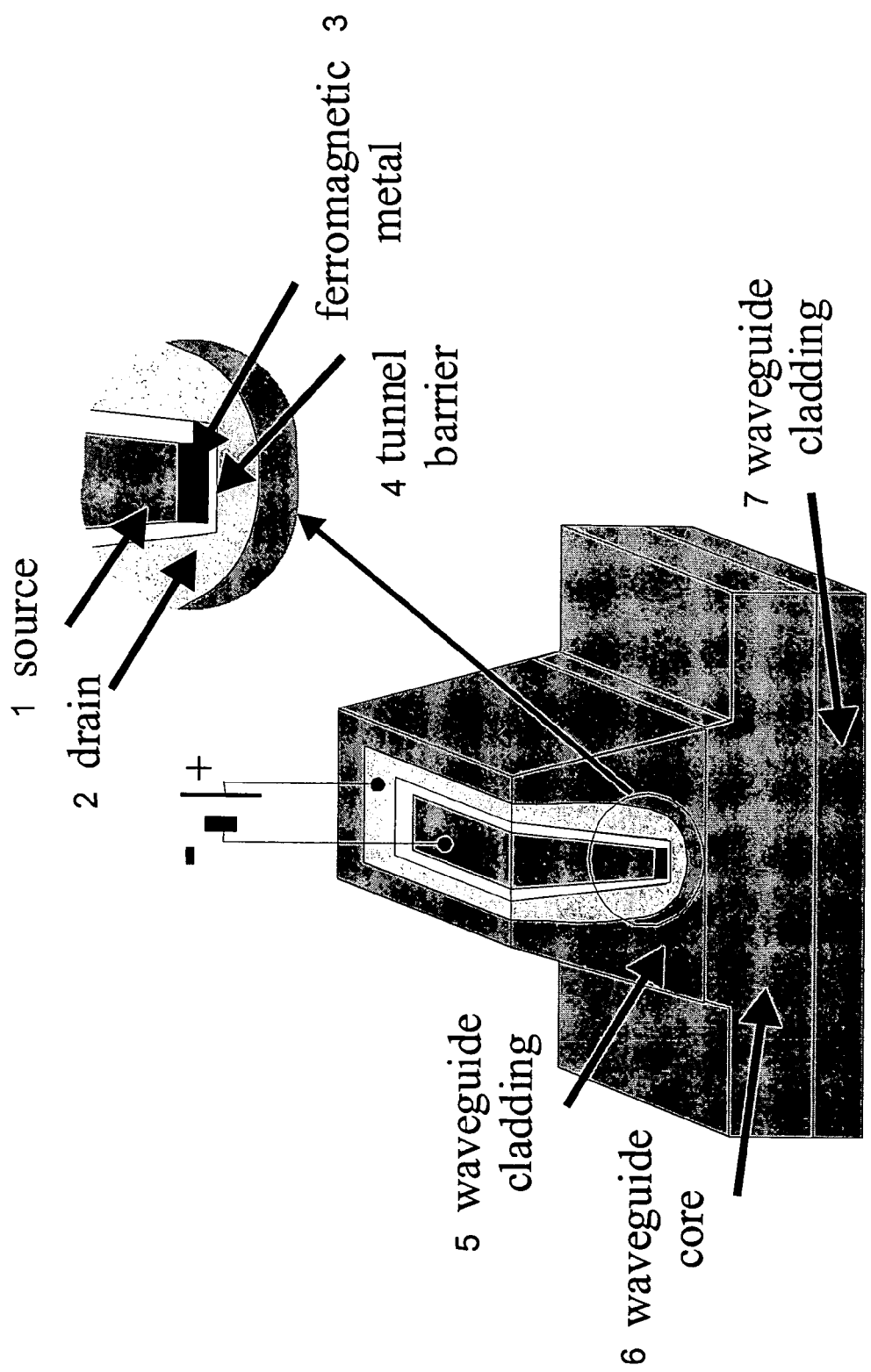
FIG. 2 shows a schematic diagram illustrating an optical memory element according to the present invention.

FIG. 2 shows a schematic diagram illustrating an optical memory element according to the present invention. The memory element comprises an optical rib waveguide with embedded ferromagnetic metal. The waveguide made up of a core region (6) sandwiched between two cladding regions (5) and (7). Light propagates inside the core region (6) along the rib. Light penetrates into the cladding regions (5) and interacts with the ferromagnetic metal. Data is stored in ferromagnetic metal through two opposite directions of magnetization along magnetization easy axes. Ferromagnetic metal is surrounded by a first conductive region (1) on one side and a tunnel barrier (4) following a second conductive region (2) on the other side. The voltage is applied between first and second conductive regions.

Figure 3:
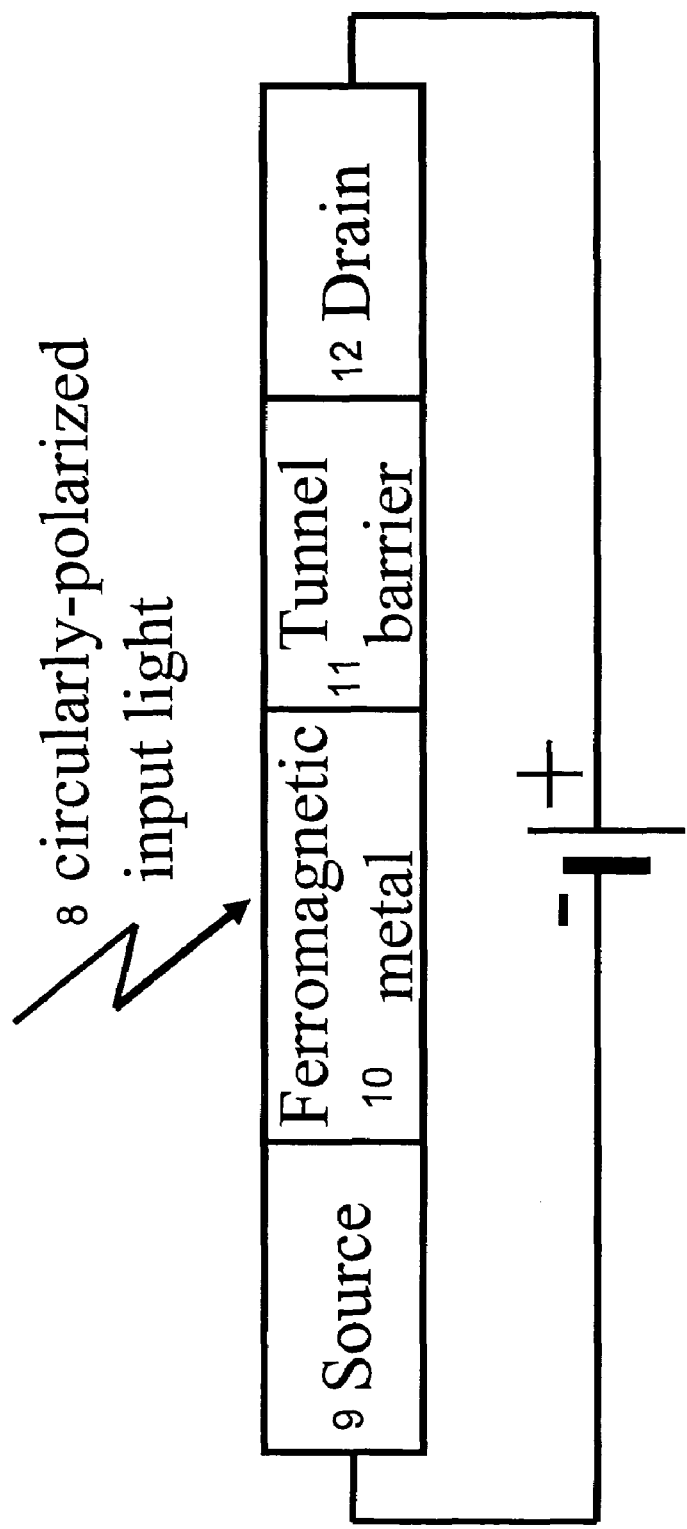
FIG. 3 shows a schematic diagram illustrating a recording method for a memory element according to the present invention (in case of light absorption by ferromagnetic metal)

FIG. 3 shows a schematic diagram illustrating a recording method for a memory element according to the present invention (in case of light absorption by ferromagnetic metal). Negative voltage is applied to the conductive region near the ferromagnetic metal. That region is a source for electrons. Positive voltage is applied to the conductive regions near the tunnel barrier. That is a drain for electrons. Circularly-polarized light of data pulse illuminates the ferromagnetic metal. Circularly-polarized light is absorbed by the ferromagnetic metal. In the ferromagnetic metal region, due to the absorption of light the spin-polarized electrons are excited. The excited spin-polarized electrons are tunneling through the tunnel barrier into the drain. Non-spin-polarized current flows from the ferromagnetic metal into the drain region. There is a spin accumulation in ferromagnetic metal. The torque of accumulated spin reverses magnetization of ferromagnetic metal. The data is stored.

Figure 4:
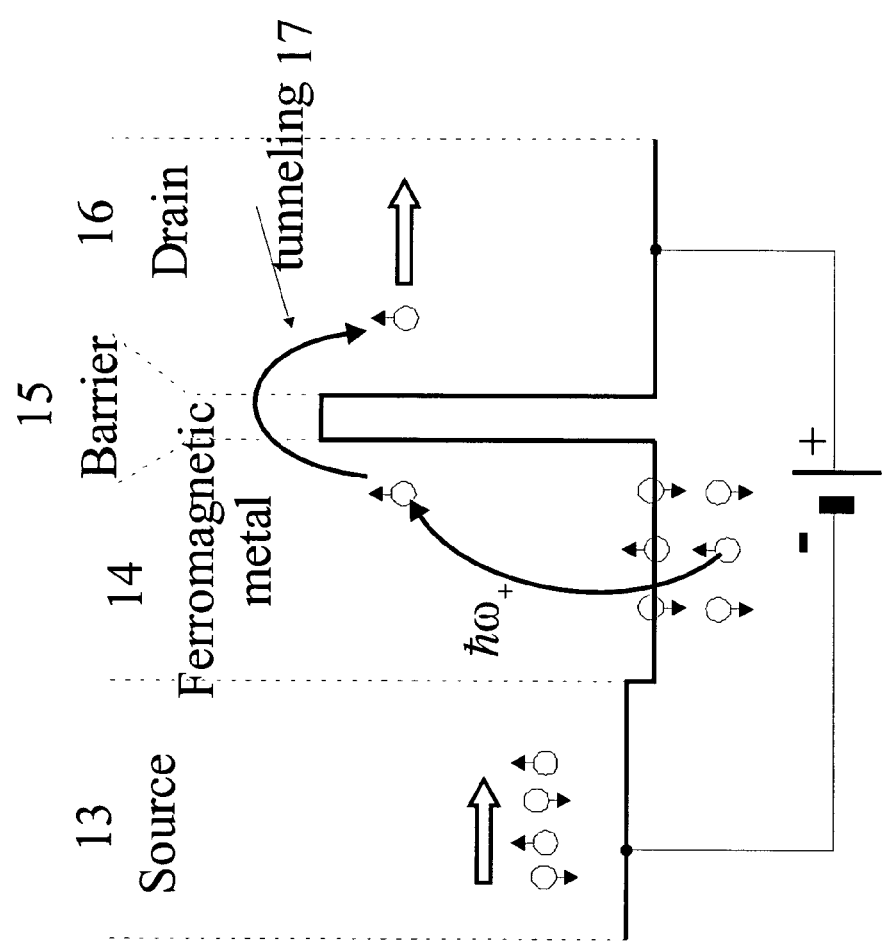
FIG. 4 shows a band diagram and operational principal illustrating a recording method for a memory according to the present invention (in case of light absorption by ferromagnetic metal)

FIG. 4 shows a band diagram and operational principal illustrating a recording method for a memory according to the present invention (the case of light absorption by ferromagnetic metal (10)). Negative voltage is applied to the conductive region (9) near the ferromagnetic metal. That region is a source for electrons. Positive voltage is applied to the conductive regions (12) near the tunnel barrier (11). That is a drain for electrons. The tunnel barrier is high enough that without light illumination there is no current through the tunnel barrier. When circularly-polarized light (8) of data pulse illuminates the ferromagnetic metal (10), circularly-polarized light is absorbed by the ferromagnetic metal. In the ferromagnetic metal region, the absorption of light excites spin-polarized electrons (up-spin electrons). The excited spin-polarized electrons tunnel through the tunnel barrier into the drain thereby causing electron current. Since the current from the ferromagnetic metal to the drain is spin-polarized (up-spin only) and current from the source to the ferromagnetic metal is not spin-polarized (both spin-up and spin-down), there is a spin accumulation in the ferromagnetic metal (spin-down accumulation). The torque of accumulated spin reverses magnetization of the ferromagnetic metal and the data is memorized.

Figure 5:
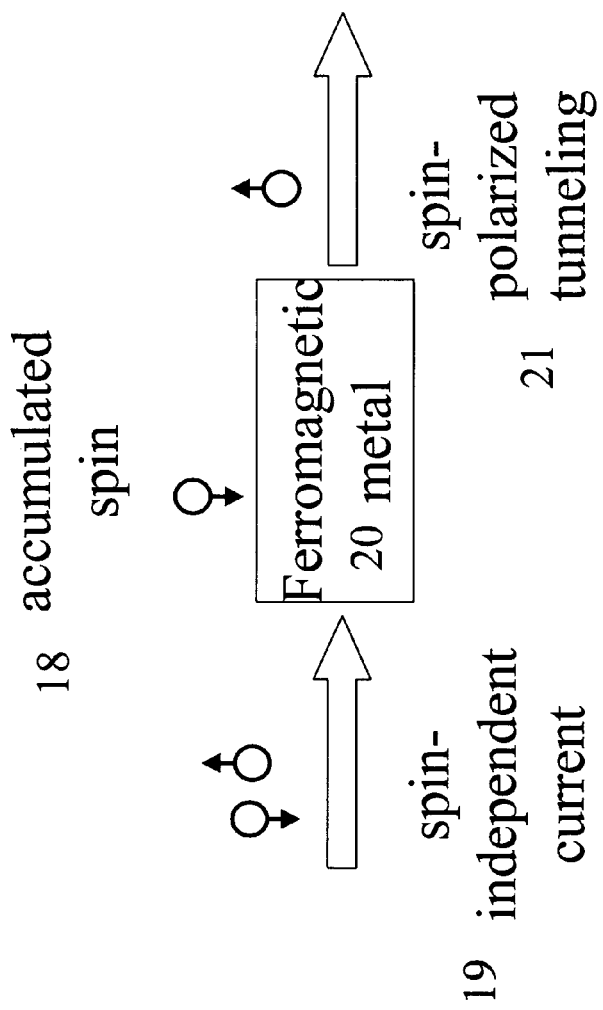
FIG. 5 shows a schematic diagram illustrating an optically-induced spin accumulation in the ferromagnetic metal region (in case of light absorption by ferromagnetic metal)

FIG. 5 shows a schematic diagram illustrating an optically-induced spin accumulation in the ferromagnetic metal region (in the case of light absorption by ferromagnetic metal). Only spin-up current flow from the ferromagnetic-metal into the drain. Spin-up and spin-down current flows from the source into the ferromagnetic metal. Thus, spin-down electrons are accumulated in the ferromagnetic metal region.

Figure 6:
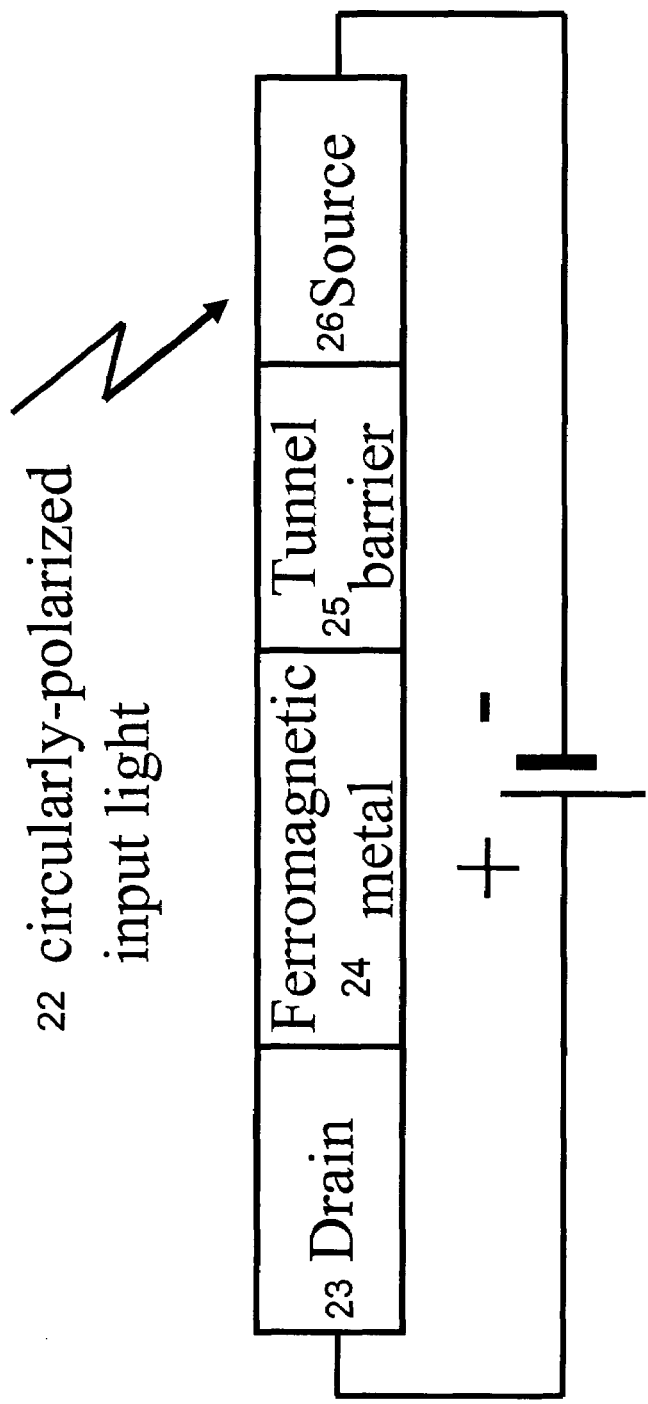
FIG. 6 shows a schematic diagram illustrating a recording method for a memory element according to the present invention (in case of light absorption by the source region)

FIG. 6 shows a schematic diagram illustrating a recording method for a memory element according to the present invention (in case of light absorption by the source region). Negative voltage is applied to a conductive region near a tunnel barrier. That region is a source for electrons. The positive voltage is applied to a conductive region near the ferromagnetic metal. That is a drain for electrons. Circularly-polarized light of data pulse illuminates a source region. The circularly-polarized light is absorbed by the source region. In the source region, due to the absorption of light, the spin-polarized electrons are excited. The excited spin-polarized electrons tunnel through the tunnel barrier into the ferromagnetic metal region. Non-spin-polarized current flows from the ferromagnetic metal to the drain region. There is a spin accumulation in ferromagnetic metal. The torque of accumulated spin reverses magnetization of ferromagnetic metal. The data is stored.

Figure 7:
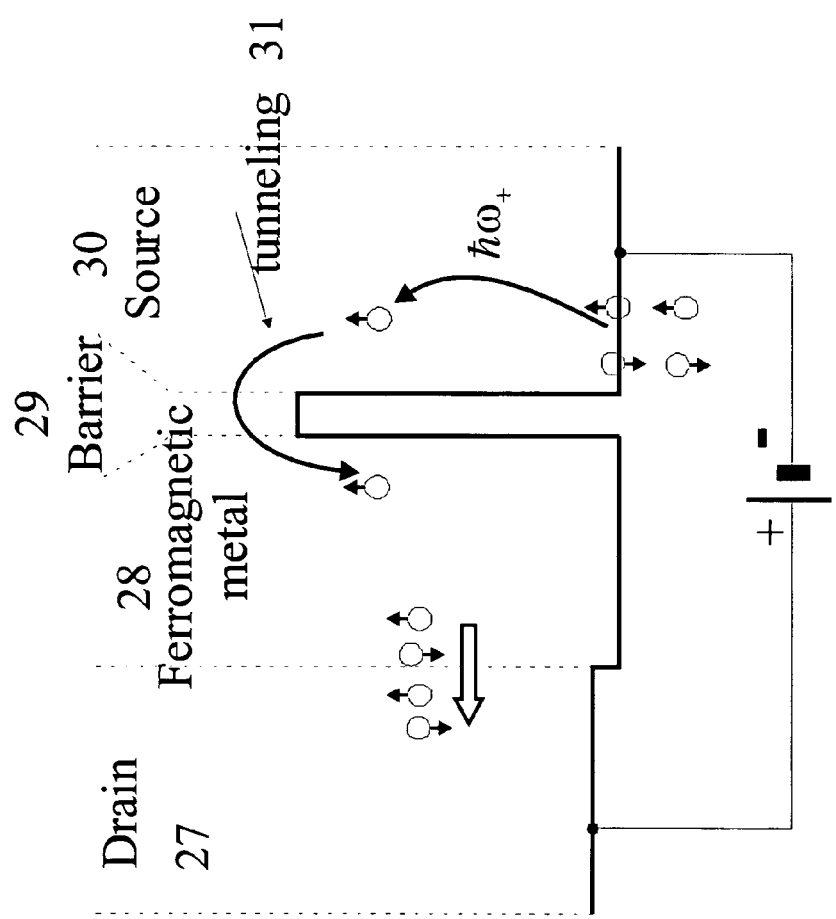
FIG. 7 shows a band diagram and operational principal illustrating a recording method for a memory according to the present invention (in case of light absorption by the source region)

FIG. 7 shows a band diagram and operational principal illustrating a recording method for a memory according to the present invention (in the case of light absorption by the source region). Negative voltage is applied to the conductive region near the tunnel barrier. That region is the source for electrons. Positive voltage is applied to the conductive regions near the ferromagnetic metal. That is the drain for electrons. The tunnel barrier is high enough that, without light illumination, there is no current through the tunnel barrier. Circularly-polarized light of data pulse illuminates the source region. The circularly-polarized light is absorbed by the source region. In source region, the absorption of light excites spin-polarized electrons (up-spin electrons). The excited spin-polarized electrons tunnel through the tunnel barrier into the ferromagnetic metal thereby causing electron current. Since the current from the source to the ferromagnetic metal is spin polarized (up-spin only) and current from the ferromagnetic metal to the drain is not spin-polarized (both spin-up and spin-down), there is a spin accumulation in the ferromagnetic metal (spin-up accumulation). The torque of accumulated spin reverses magnetization of ferromagnetic metal and the data is memorized.

Figure 8:
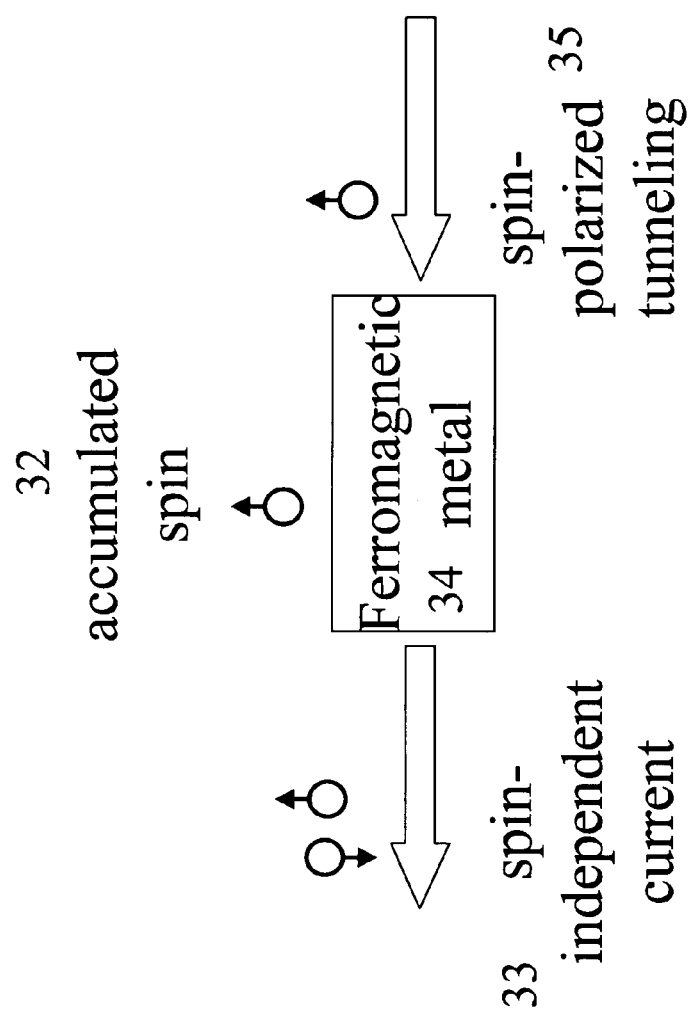
FIG. 8 shows a schematic diagram illustrating an optically-induced spin accumulation in the ferromagnetic metal region (in case of light absorption by the source region)

FIG. 8 shows a schematic diagram illustrating an optically-induced spin accumulation in the ferromagnetic metal region (in the case of light absorption by the source region). Only spin-up current flow from the source into the ferromagnetic-metal. Spin-up and spin-down current flows from the ferromagnetic metal into the drain. Thus, spin-up electrons are accumulated in the ferromagnetic metal region.

Figure 9:
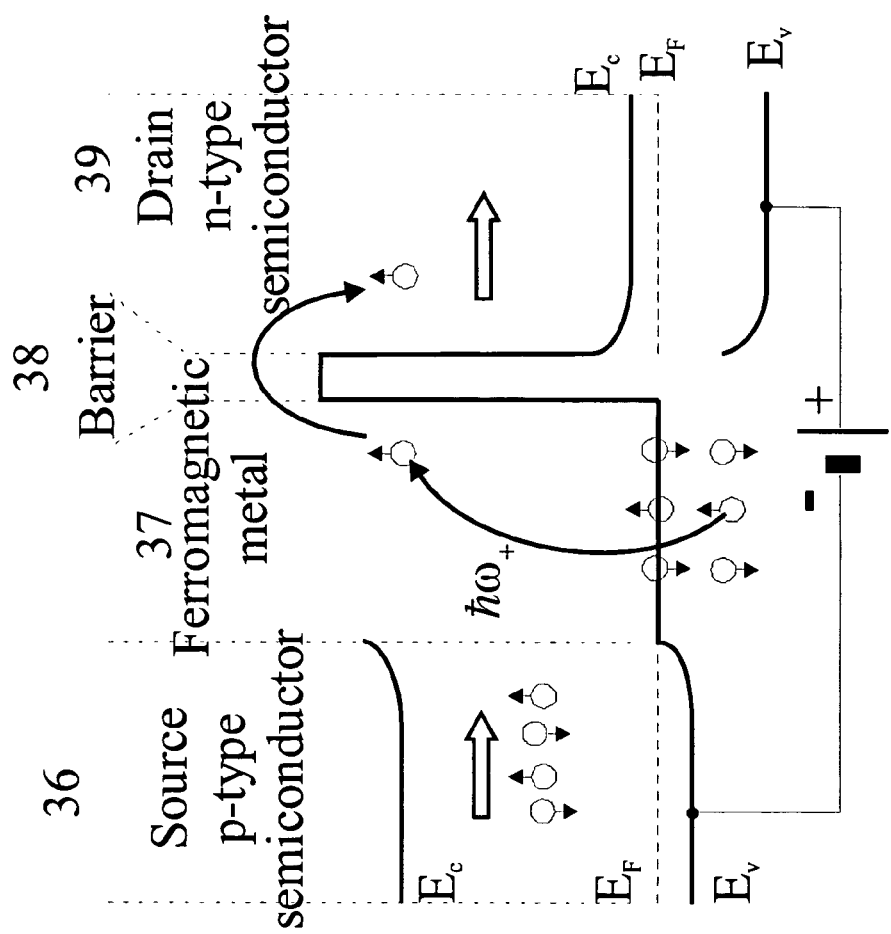
FIG. 9 shows a band diagram and operational principal illustrating a recording method for the memory element depicted in FIG. 4, where a source and a drain are made of semiconductors.

FIG. 9 shows a band diagram and operational principal illustrating a recording method for the memory element shown in FIG. 4, where the source and the drain are made of semiconductors. Since ferromagnetic transition metals (like Co, Fe, Ni) form Ohmic contact with p-type semiconductors, the source material is made of p-type semiconductor. There is an Ohmic contact between the ferromagnetic metal and the source. The drain is made of n-type semiconductors. The bandgap energy of semiconductor of both the drain and the source is high enough that the light is not absorbed by the source and the drain. The light is absorbed only by the ferromagnetic metal.

Figure 10:
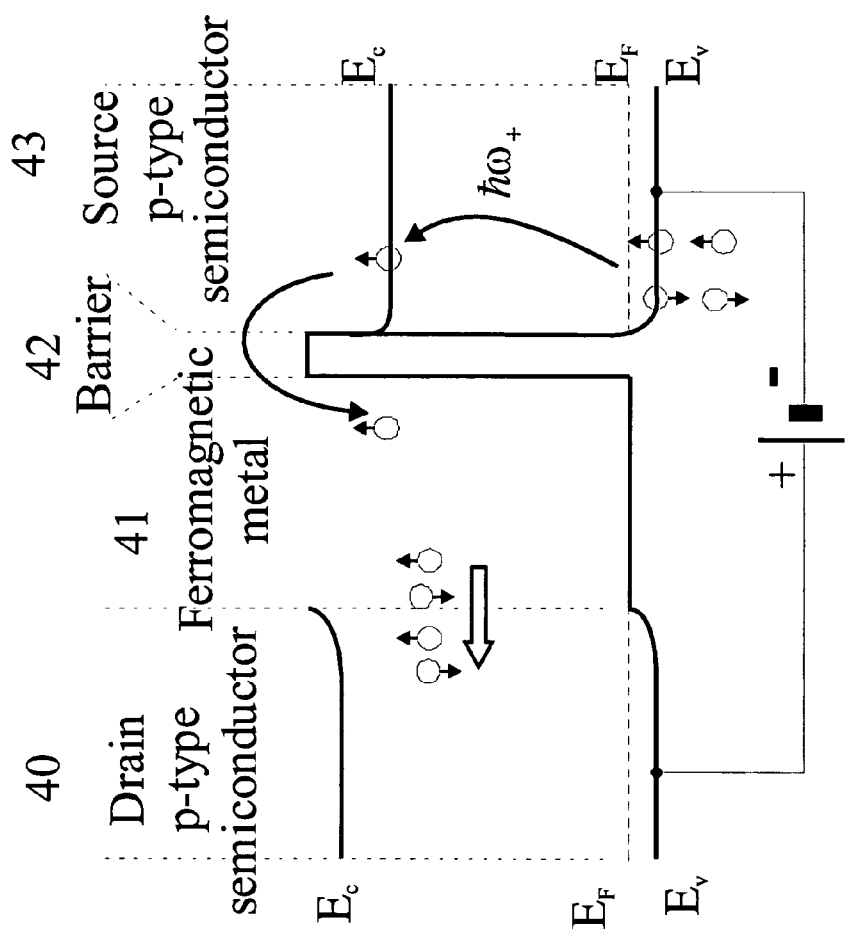
FIG. 10 shows a band diagram and operational principal illustrating a recording method for a memory element depicted in FIG. 7, where source and drain made of semiconductors.

FIG. 10 shows a band diagram and operational principal illustrating a recording method for the memory element shown in FIG. 7, where a source and a drain are made of semiconductors. The both the source and drain are made of p-type semiconductor. There is an Ohmic contact between the ferromagnetic metal and the source. The bandgap energy of the drain is high enough that the light is not absorbed by the drain. The bandgap energy of the source is equal or smaller than photon energy of light. Thus, light excites electrons in the source region from a valance band to a conductive band. Such a structure has a long life time for interband transitions in semiconductors, which leads to high efficiency of spin accumulation.

Figure 11:
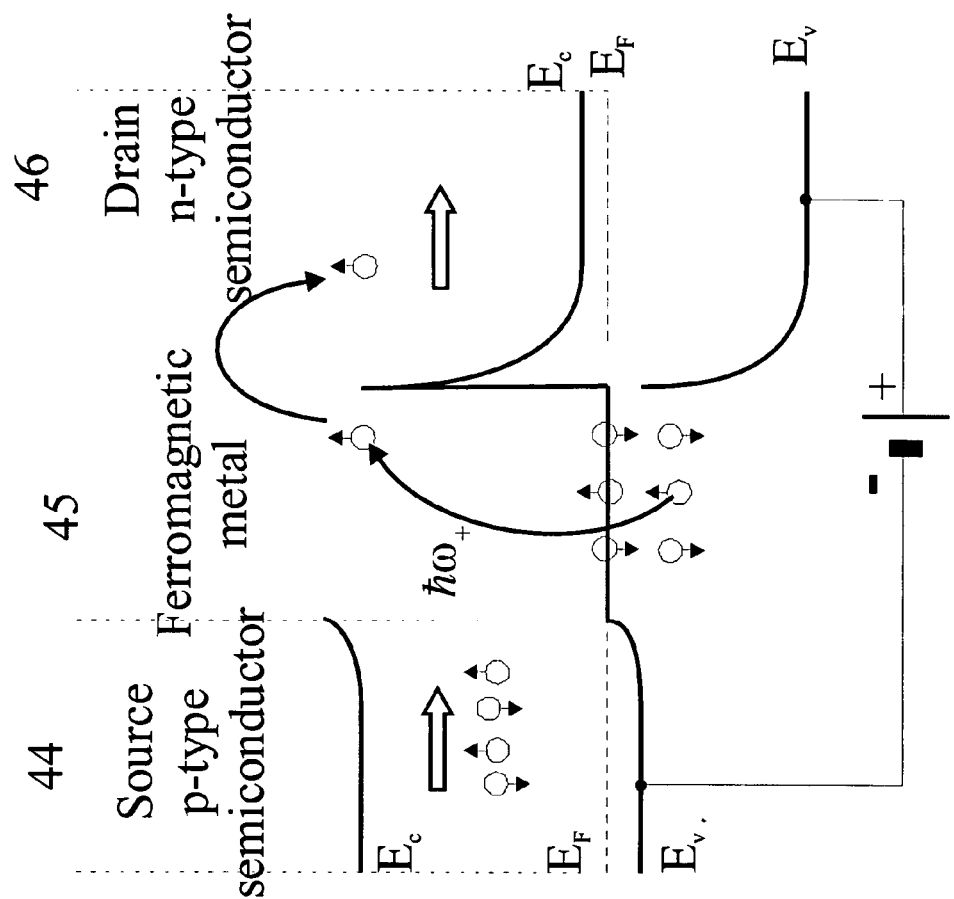
FIG. 11 shows a band diagram and operational principal illustrating a recording method for a memory element depicted in FIG. 4, where a source and a drain are made of semiconductors and tunnel barrier is formed by Shottky barrier on the contact of metal and semiconductor.

FIG. 11 shows a band diagram and operational principal illustrating recording method for the memory element depicted in FIG. 4, where the source and drain are made of semiconductors and a tunnel barrier is formed by Shottky barrier in which metal and semiconductor is in contact. The source is p-type semiconductor and the drain is n-type semiconductor. Since ferromagnetic transition metals (like Co, Fe, Ni) form Ohmic contact with p-type semiconductors and Schottky contact with n-type semiconductor, there is a barrier at drain-ferromagnetic-metal boundary and there is no barrier at source-ferromagnetic-metal boundary.

Figure 12:
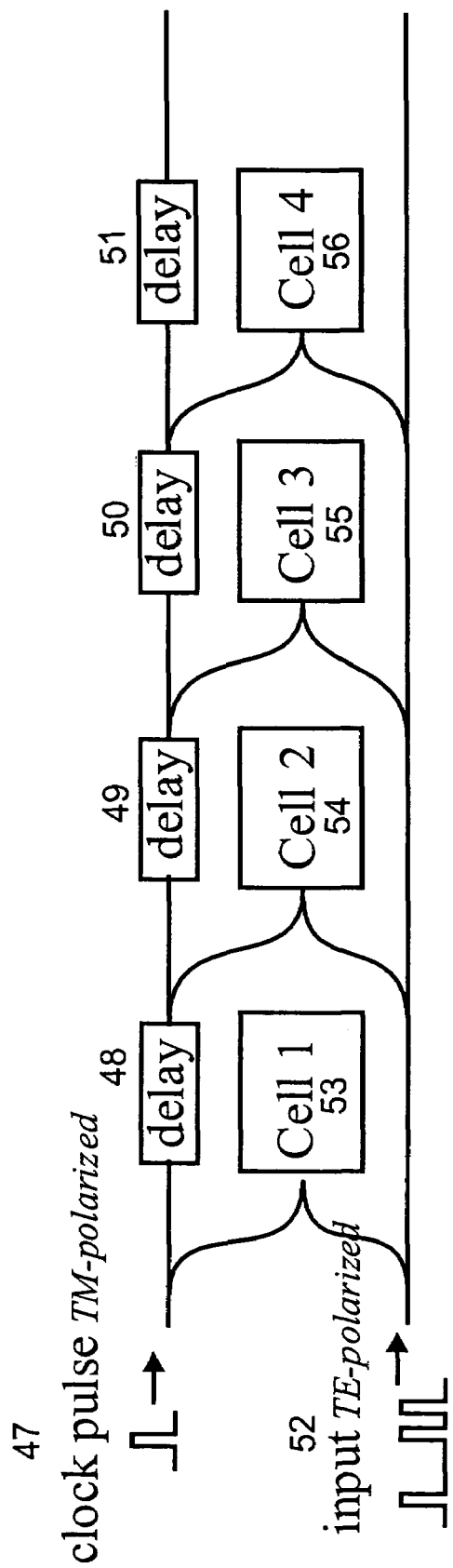
FIG. 12 shows a schematic diagram illustrating a recording method into a memory device, which contains 4 memory elements according to the present invention.

FIG. 12 shows a schematic diagram illustrating a method for recording pulse train in a memory device, which contains 4 memory elements according to the present invention. The memory elements are referred to as "Cell 1", "Cell 2", "Cell 3" and "Cell 4". There are two input waveguide paths. One is for input of data pulses and another one is for clock pulse. Polarization of clock pulse and input pulses should be mutually orthogonal. In the figure, the polarization of input pulses is depicted as "TE" and polarization of clock pulse is depicted as "TM". Each memory element is illuminated by the input pulses and the clock pulse. From cell to cell, the clock pulse has addition of delay, which equals to the period of input pulses. For first cell, the clock time arrives at the same time as a first one of input pulses. For a second cell, the clock time arrives at the same time as a second one of the input pulses and so on. The phase of the input pulses is shifted by a quarter of wavelength period proportional to the phase of input pulses. Intensities of input pulses and clock pulse are adjusted to be equal. Thus, at each cell, TE polarized input pulse and quarter-period phase-shifted TM-polarized clock pulse are combined to form a circular polarized pulse. The circularly polarized pulse reverses magnetization of ferromagnetic metal of a memory element.

FIGS. 13A, 13B, 13C and 13D show a schematic diagrams illustrating a time diagram for an input pulse train and clock pulse at different cells. Polarization of input and clock pulses is mutually orthogonal. For the Cell 1, a clock pulse and a first input pulse arrive at the same time. Their polarization and phase are so as to form a circularly polarized pulse. The circularly polarized pulse excites only spin-up electrons. That causes spin accumulation and magnetization reversal of the ferromagnetic metal. Thus, the data of the first input pulse is memorized at Cell 1. Second, third and forth pulses are linearly polarized, so that they excite equally spin-up and spin-down electrons. They do not effect on magnetization of ferromagnetic metal of Cell 1. For the Cell 2, the clock pulse is delayed so the clock pulse and second input pulse arrive at the same time at this cell. Their polarization and phase are set so as to form a circularly polarized pulse. The circularly polarized pulse excites only spin-up electrons. That causes spin accumulation and magnetization reversal of ferromagnetic metal. Thus, data of the second input pulse is memorized at Cell 2. First, third and forth pulses are linearly polarized, so as to excite equally spin-up and spin-down electrons. They do not effect on magnetization of ferromagnetic metal of Cell 2.

Figure 14:
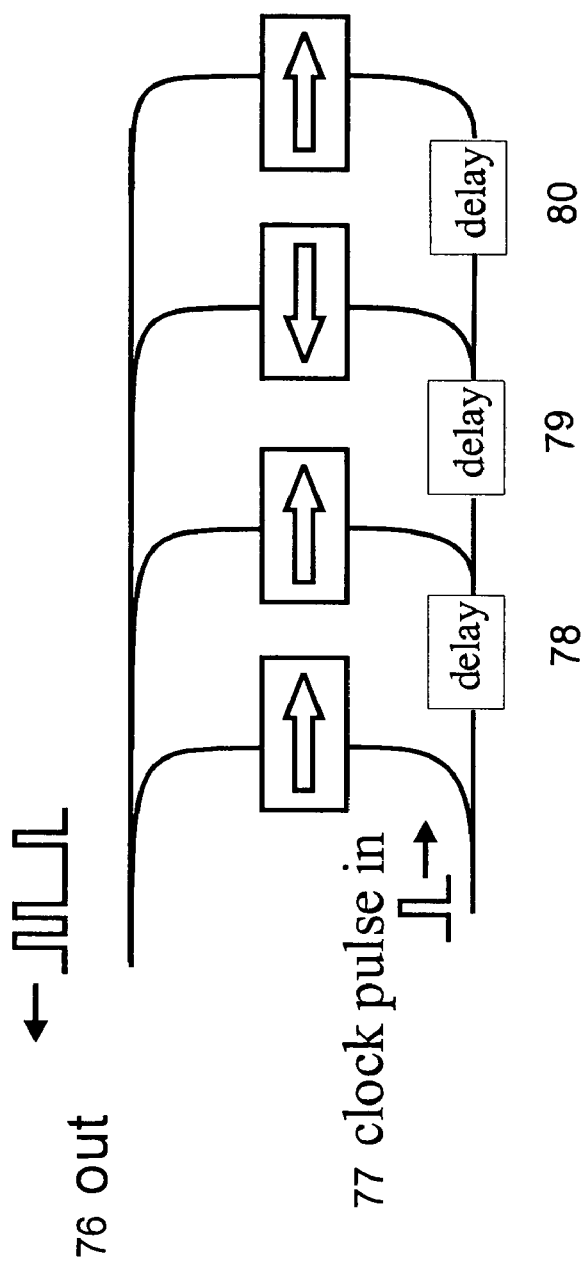
FIG. 14 shows a schematic diagram illustrating reading method from memory device, which contains 4 memory elements of present invention. The easy axis of ferromagnetic metal is directed perpendicularly to waveguide of reading line.

FIG. 14 shows a schematic diagram illustrating a reading method from a memory device, which contains 4 memory elements according to the present invention. The easy axis of ferromagnetic metal is directed perpendicularly to a waveguide of reading line. An optical gain is provided to compensate the absorption of ferromagnetic metal. As it was shown in (W. Zaets and K. Ando IEEE Photon. Technol. Lett. Vol. 11, pp. 1012–1014, August 1999), in this case the light will be absorbed or amplified depending on a direction of magnetization of ferromagnetic metal. In the example of FIG. 14, the light will be amplified if the magnetization is directed to the left, and the light is absorbed if the magnetization is directed to the right. The clock pulse passes through each memory element and is coupled into an output waveguide path. The clock pulse has different delay for each memory cell, thus a pulse train forms at output line. The sequence of pulses in pulse train corresponds to data stored in memory cells.

Figure 15:
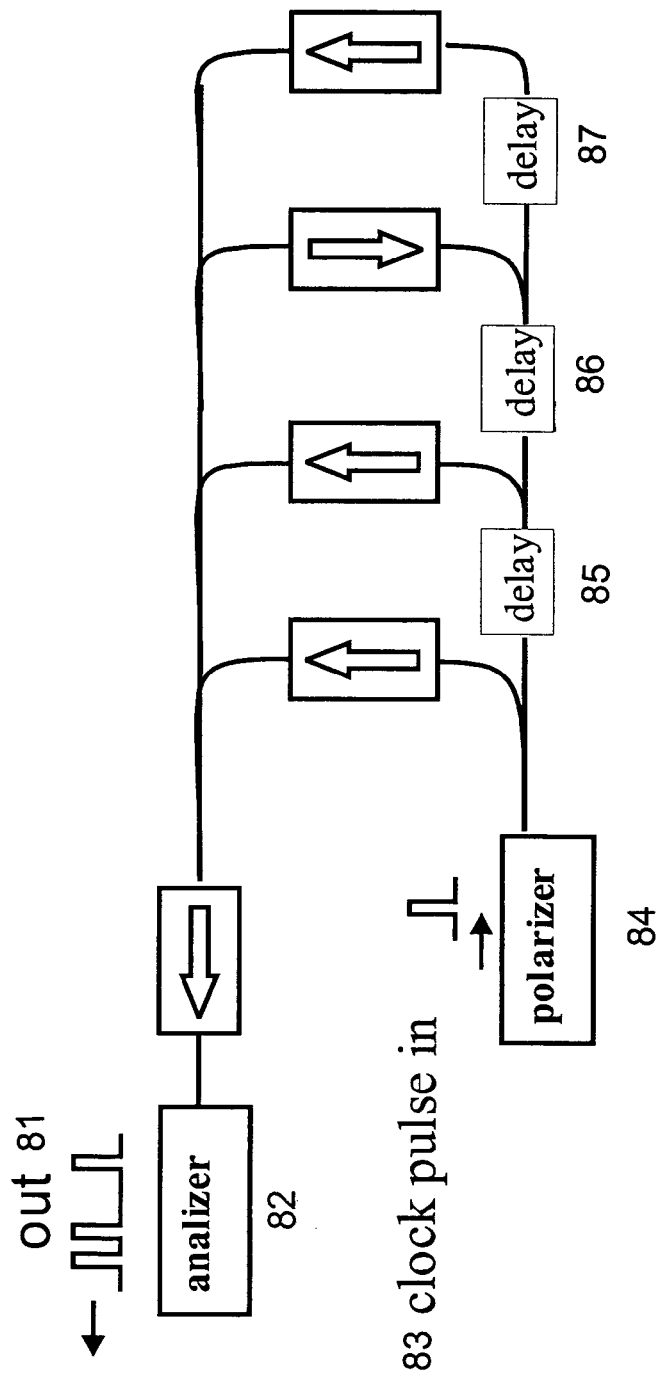
FIG. 15 shows a schematic diagram illustrating reading method from memory device, which contains 4 memory elements of present invention. The easy axis of ferromagnetic metal is directed along to waveguide of reading line.

FIG. 15 shows a schematic diagram illustrating a reading method from a memory device, which contains 4 memory elements according to the present invention. The easy axis of ferromagnetic metal is directed to and along a waveguide of reading line. The polarization of light rotates in clockwise or counterclockwise direction, depending on the magnetization direction of ferromagnetic metal. The clock pulse passes through each memory element and is coupled into an output line. The clock pulse has different delay for each memory cell, thus a pulse train forms at an output line. At the common output line, there is one more cell ("common cell") followed by analyzer. An axis of analyzer is perpendicular to the axis of the polarizer. Magnetization of the common cell, for example, is along a propagation direction and polarization rotation is clockwise. For memory cells, in which magnetization direction is opposite to propagation direction and polarization rotation is counterclockwise, a pulse passes through this cell, and at the common cell no polarization rotation is carried out as a whole. Thus, it will be blocked by the analyzer. For memory cells, in which magnetization direction is along propagation direction, and polarization rotation is clockwise, a pulse passes through this cell, and at the common cell non-zero clockwise polarization rotation is carried out as a whole. Thus, it will pass through the analyzer. Thus, the sequence of pulses in the pulse train after the analyzer corresponds to data stored in memory cells.

As explained above in detail, according to the present invention, it is possible to obtain the effects set forth below.
1. It is possible to record and read optical data at very high speed.
2. It is possible to use non-volatile memory in optical communication links.

As mentioned above, although the best forms for carrying out the present invention are explained in connection with the Embodiments, the present invention is not limited to these embodiments. For Example, The disclosure of Japanese Patent Application No. 2004-197964 filed on Jul. 5, 2004 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A non-volatile optical memory element comprises: an optical waveguide, which has a core region embedded between two cladding regions, wherein a refractive index of the core region is higher than that of the cladding regions, a ferromagnetic-metal region embedded inside the cladding region or the core region, a non-conductive tunnel-barrier region interposed between a first conductive region and a second conductive region, wherein the ferromagnetic-metal region is interposed between the first conductive region and the tunnel-barrier region followed by the second conductive region, and the ferromagnetic-metal region is close enough to the waveguide core region in which light propagating in the waveguide penetrates into the ferromagnetic metal region, and a size and form of the ferromagnetic metal region is adjusted so that the ferromagnetic metal region is in a single-domain state, and data is stored in the memory element in two opposite directions of magnetization of the ferromagnetic-metal region.

2. A recording method of a circularly-polarized pulse into the memory element according to claim 1, by reversal of magnetization ferromagnetic-metal region due to an arrival optical pulse, the method comprising the following steps:
    applying negative voltage to the first conductive region and positive voltage to the second conductive region so that without illumination of light, the tunneling from the ferromagnetic-metal region into second-conductive region is small;
    illuminating the memory element by a circularly-polarized pulse by coupling input light pulse into the optical waveguide;
    exciting the electrons by the circularly-polarized optical pulse in the ferromagnetic-metal region to higher energy level, wherein polarization of the optical pulse is such that the excited electrons are of the same spin polarization or up-spin, and the excited up-spin electrons tunnels from the ferromagnetic-metal region into the second-conductive region;
    making non-spin-polarized electrons, said both up-spin and down-spin electrons, flow from the first-conductive region into the ferromagnetic-metal region;
    accumulating down-spin electrons in the ferromagnetic-metal region; and reversing magnetization of the ferromagnetic-metal region due to torque of accumulated down-spin electrons.

3. A recording method of a circularly-polarized pulse into the memory element according to claim 1 by reversal of magnetization ferromagnetic-metal region due to an arrival optical pulse, the method comprising the following steps of:

applying positive voltage to the first conductive region and negative voltage to the second conductive region so that without illumination of light, the tunneling from ferromagnetic-metal region into second-conductive region is small;

illuminating the memory element with a circularly-polarized input pulse by coupling input light pulse into the optical waveguide;

exciting the electrons by the circularly-polarized optical pulse in the second-conductive region to higher energy level, wherein polarization of the optical pulse is such that the excited electrons are of the same spin polarization or up-spin and the excited up-spin electrons tunnels from the second-conductive region into the ferromagnetic-metal region;

making non-spin-polarized electrons, said up-spin and down-spin electrons, flow from the ferromagnetic-metal region into the first-conductive region;

accumulating up-spin electrons in the ferromagnetic-metal region; and reversing magnetization of the ferromagnetic-metal region due to torque of accumulated up-spin electrons.

4. The non-volatile optical memory element according to claim 1, wherein the ferromagnetic metal region contains at least one of transition metals (Cr, Mn, Fe, Co, or Ni) and their alloys; the first conductive region is made of a semiconductor with p-type doping; and the second conductive region is made of semiconductor with n-type doping.

5. The non-volatile optical memory element according to claim 4, wherein the tunnel barrier region is formed by Schottky contact between the ferromagnetic metal region and a semiconductor with n-type doping.

6. The non-volatile optical memory element according to claim 1, wherein the ferromagnetic region contains at least one of transition metals (Cr, Mn, Fe, Co, Ni) and their alloys; the first conductive region is made of a semiconductor with p-type doping; and the second conductive region is made of semiconductor with p-type doping.

7. The memory elements according to any one of claims 1, and 4–5, further including a reading waveguide path, wherein the reading waveguide path is directed perpendicularly to a direction of magnetization of ferromagnetic metal, an optical waveguide of reading path has a core region embedded between two cladding regions, a refractive index of the core region is higher than that of cladding regions, the ferromagnetic metal region is formed inside the waveguide cladding region, the optical gain is provided by an active region formed inside the waveguide core layer, gain is adjusted so that for one direction of magnetization, the light is absorbed and for opposite direction of magnetization, the light is amplified, and depending on data stored in the memory element, the light passes through reading waveguide path or is stopped.

8. The memory elements according to any one of claims 1, 4–5, further including a reading waveguide path, wherein the reading waveguide path is directed along a direction of magnetization of ferromagnetic metal, an optical waveguide of reading line having a core region embedded between two cladding regions, a refractive index of the core region is higher than that of cladding regions, the ferromagnetic metal region is formed inside waveguide cladding region region, the pulse passing memory element undergoes the polarization rotation due to Faraday effect of ferromagnetic metal and a direction of the polarization rotation corresponds to the magnetization direction of ferromagnetic metal.

9. The memory device containing the memory elements according to any one of claims 1 and 4–5, further including delay elements, an input waveguide path, and a clock-pulse waveguide path.

10. The memory device according to claim 9 wherein optical gain is provided for the input and the clock-pulse waveguide paths.

11. A memory device containing the memory elements according to claims 10 having elements for recording, further including elements for reading, which includes delay elements, an output waveguide path and a clock-pulse waveguide path, wherein the clock pulse is coupled into each memory element, passing through each memory element and coupled into output waveguide path by connecting the output waveguide path and the clock-pulse waveguide path to each memory element, and from one memory element to next memory element, the clock pulse is delayed for time period equal to the period of pulses of output pulse train, so that depending on data stored in a memory element, the clock-pulse passes through the memory element or is stopped and the sequence of pulses in pulse train corresponds to data stored in memory cells.

12. The memory element according to claim 11, wherein a reading waveguide path and a recording waveguide path utilize the same waveguide.

13. The memory element according to claim 11, wherein ferromagnetic metal is formed inside waveguide core region.

14. Memory device containing the memory elements according to claims 11 having elements for recording, further including elements for reading, which includes delay elements, output waveguide path, clock-pulse waveguide path, analyzer, polarizer and polarization rotator, an axis of analyzer is perpendicular to an axis of the polarizer, the rotation angle of the polarization rotator is adjusted to be the same as a polarization rotation angle for light passing for reading waveguide path of a memory element, a clock pulse passing polarizer is coupled into clock-pulse waveguide path, delayed clock pulse passing reading waveguide path of each memory element is coupled into an output waveguide path, an output pulse train is obtained by the polarization rotator followed by the analyzer, from one memory element to next memory element, the clock pulse is delayed for time period equal to the period of pulses of output pulse train, for memory cells, where a direction of polarization rotation is opposite to rotation by polarization rotator, the pulse passing memory element and polarization rotator has zero angle of polarization rotation as a whole, such pulse is stopped by the analyzer, for memory cells, where a direction of polarization rotation is the same as a rotation by the polarization rotator, the pulse passing memory element and polarization rotator have non-zero angle of polarization rotation as a whole, and such pulse passes through the analyzer so that the sequence of pulses in pulse train corresponds to data stored in memory cells.

* * * * *